United States Patent [19]
Liu et al.

[11] Patent Number: 6,153,361
[45] Date of Patent: Nov. 28, 2000

[54] METHOD OF REMOVING PHOTORESIST AT THE EDGE OF WAFERS

[75] Inventors: Ming-Hua Liu, Taichung; Chuck Chen, Feng-Shan; Shu-Ping Lin, Chiayi; Eddie Chen; Ming-Tzong Yung, both of Hsinchu, all of Taiwan

[73] Assignee: United Microelectronics Corp, Taiwan

[21] Appl. No.: 09/236,922

[22] Filed: Jan. 25, 1999

[30]  Foreign Application Priority Data

Jan. 19, 1999 [TW]  Taiwan .................................. 88100745

[51] Int. Cl.[7] ........................... G03C 5/00; H01L 21/302; C23F 1/02
[52] U.S. Cl. ................................. 430/331; 216/88; 216/92
[58] Field of Search ............................. 430/331; 427/62, 427/96, 231; 216/92, 88

[56]  References Cited

U.S. PATENT DOCUMENTS

| | | | |
|---|---|---|---|
| 4,510,176 | 4/1985 | Cuthbert et al. | 427/82 |
| 5,328,871 | 7/1994 | Tanigawa et al. | 427/231 |
| 5,425,846 | 6/1995 | Koze et al. | 156/646.1 |
| 5,879,577 | 3/1999 | Weng et al. | 216/92 |

*Primary Examiner*—Shean C. Wu
*Attorney, Agent, or Firm*—Blakely Sokoloff Taylor & Zafman

[57]  ABSTRACT

A method of removing photoresist at the edge of wafers in an integrated circuit the method comprising the following steps. A substrate having at least a MOS component region thereabove is provided. A photoresist layer is formed over the substrate. A pattern is defined on the photoresist layer by exposure and development. The photoresist layer at the edge of the substrate is removed by a chemical reagent and centrifugal effect.

6 Claims, 7 Drawing Sheets

METHOD OF REMOVING PHOTORESIST AT THE EDGE OF WAFERS

BACKGROUND OF THE INVENTION

1. Field of the Invention

This invention relates in general to the photolithography fabrication of semiconductor integrated circuits (ICs), and more particularly to the method of removing photolesist at the edge of wafers in DRAM fabrications.

2. Description of Related Art

The photolithography process is the most important process in semiconductor integrated circuits. Patterns of each layer and doping regions are defined by the photolithography processes. Briefly, the integrity of the semiconductor integrated circuits depends on their dimensions. The ability to decrease the dimensions depends upon the development of photolithography.

The principle of photolithography is to coat a photoresist on the surface of each wafer and then to expose the photoresist by a mask. There are transparent and opaque regions on the mask so the photoresist is patterned. After development. the character of photoresist can be divided as dissoluble and indissoluble. If the exposed regions dissolve in the developer and the unexposed regions remain on the wafer the photoresist is called positive photoresist. The pattern formed by positive photoresist on the wafer is the same with the pattern on the mask. If the exposed regions do not dissolve in the developer and the exposed regions remain on the wafer, the photoresist is called negative photoresist. The pattern formed by negative photoresist on the wafer is opposite to the pattern on the mask.

Therefore the photolithography processes comprise coating, exposure, and development. The etching and implant processes are followed by patterning the photoresist. The photoresist at the edge of wafers would affect the settlement of wafers in chip boat. Additionally it would affect the central photoresist and cause the photoresist to peel. So the photoresist at the edge of wafers should be removed to avoid the above-mentioned disadvantages. The conventional method of removing the photoresist at the edges of waters is followed by exposing the photoresist. Additional exposure process is performed to define the photoresist, but this method will generate diffraction.

FIGS. 1a through 1d show the manufacturing progression of conducting lines in DRAM device according to a conventional method. This method explains how photoresist film loss at the edge of wafers is by the effect of diffraction. Referring to FIG. 1a, an inter-poly dielectric layer 12 is provided over substrate 10. A polysilicon layer 14 is provided over inter-poly dielectric layer 12. Then, a pattern is defined on polysilicone layer 14 and inter-poly dielectric layer 12 to form a contact window 15 exposing substrate 10. A thin polysilicon layer 16 is formed over polysilicon layer 14 and contact window 15.

Referring to FIG. 1b, a photoresist layer 18 is coated over the thin polysilicon layer 16. A pattern is defined oln the photoresist layer 18 by ultraviolet rays. Then, photoresist layer 18 at the edge of wafers is defined by wafer edge exposure.

Referring to FIG. 1c, after developing a photoresist layer 18a is formed. Referring to FIG. 1d, using a photoresist layer 18a as a mask. a thin polysilicon layer 16, a polysilicone layer 14 and an inter-poly dielectric layer 12 are etched to form a dielectric layer 12a, a polysilicon layer 14a and a thin polysilicon layer 16a. Therefore, a via 20 is formed by removing photoresist layer 18a.

FIG. 2 shows the top view of via 20 in the FIG. 1d. Because of the photoresist film loss at the edge of wafers, the photoresist layer losses the function of completely masking. Therefore, a wiring line 250 is formed by the above method which is thinner than what was predetermined and the pattern will distort. FIG. 3 shows the thickness of photoresist layer 110 on the wafer 100 according to the distance of the center of the wafer 100 by conventional method. The direction of arrow "a" represents the center of the wafer. The direction of arrow "b" represents the edge of the wafer. According to FIG. 3, the thickness of photoresist layer 110 decreases from the center of the wafer to the edge of the wafer.

Conventional DRAM devices use three polysilicon layers and one metal layer. Because of the effect of diffraction, defining a photoresist layer at the edge of the wafer by the adder edge exposure will cause the photoresist layer loss. The thickness of the photoresist layer will decrease from the center of the water to the edge of the wailer. It generates about 25 $\mu$m width of transition region at the edge of the wafer. The photoresist film loss will cause the pattern transfer distortion. By using after etching inspection (ADI), we find that the conductive line pattern will become smaller and the via pattern will become larger. So some abnormal pattern will be generated in the interface among different layers. Some particles will be generated after thermal cycles or clean processes.

SUMMARY OF THE INVENTION

It is therefore an object of the present invention to provide a method for removing the photoresist at the edge of wafers to avoid the pattern distortion.

To attain these objects and advantages, and in accordance with the purpose of the invention, as embodied and broadly described herein, the invention comprises a method of removing photoresist at the edge of wafers in a integrated circuit, the method comprising following the steps. A substrate having at least a MOS component region thereabove is provided. A photoresist layer is formed over the substrate. A pattern is defined on the photoresist layer by exposure and development. The photoresist layer at the edge of the substrate is removed by a chemical reagent and centrifugal effect.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
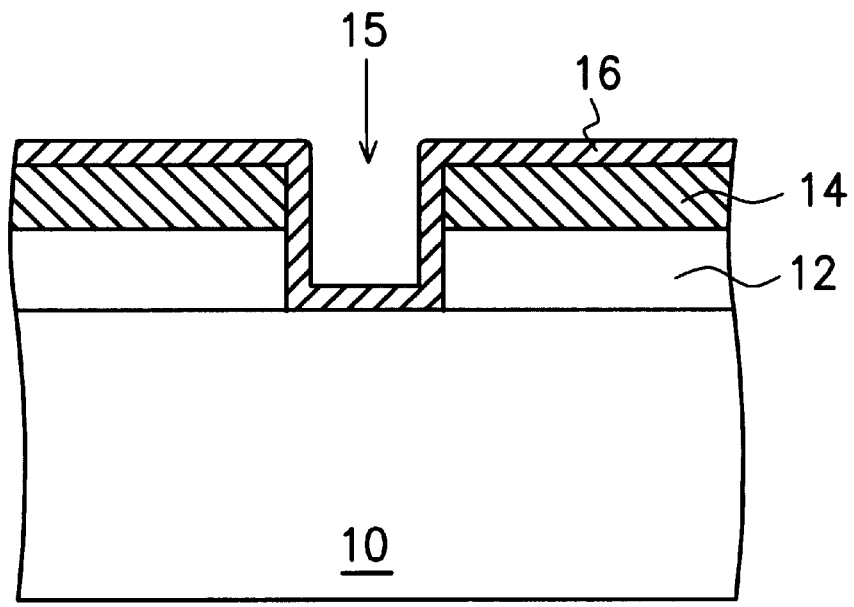
FIGS. 1a to 1d are cross-sectional views showing the progression of manufacturing steps for conducting lines in DRAM devices by a conventional process.
Figure 1B:
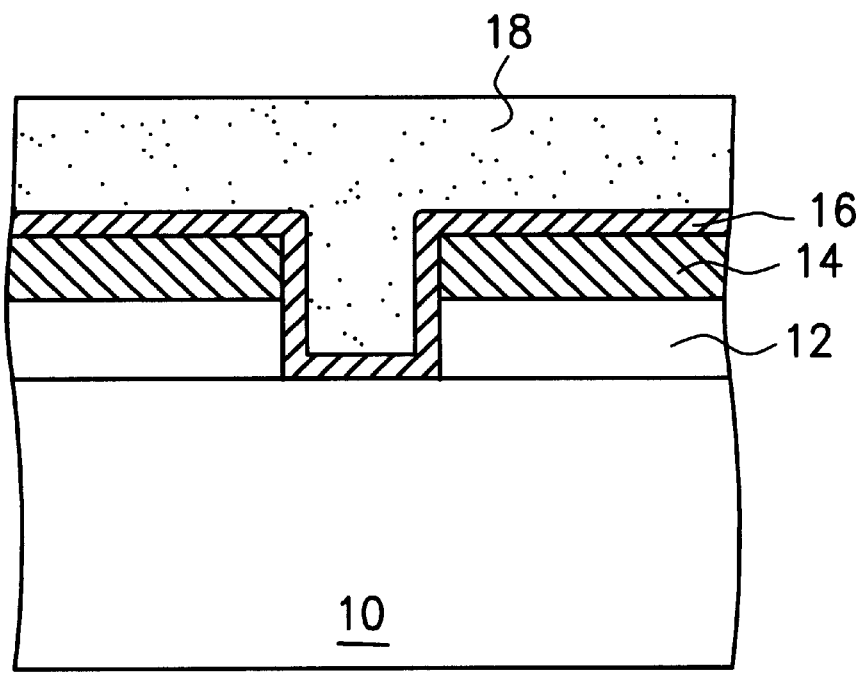
Figure 1C:
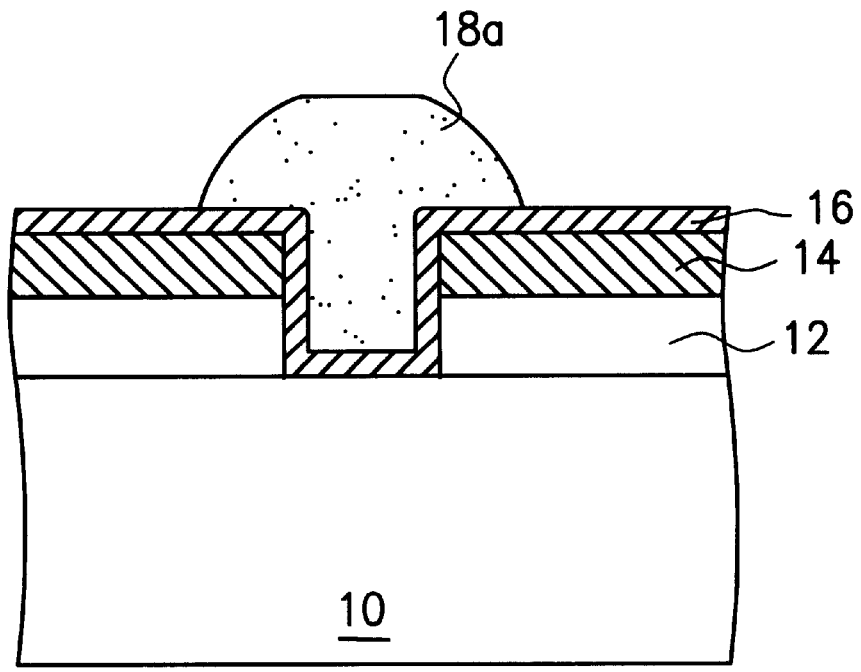
Figure 1D:
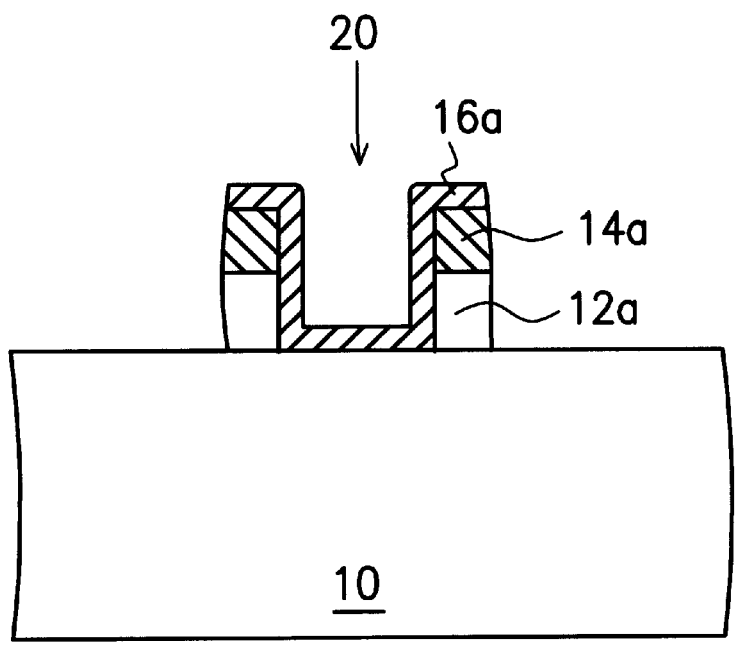
Figure 2:
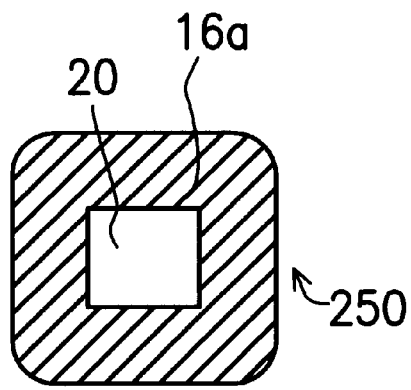
FIG. 2 shows the top view of the via in FIG. 1d.
Figure 3:
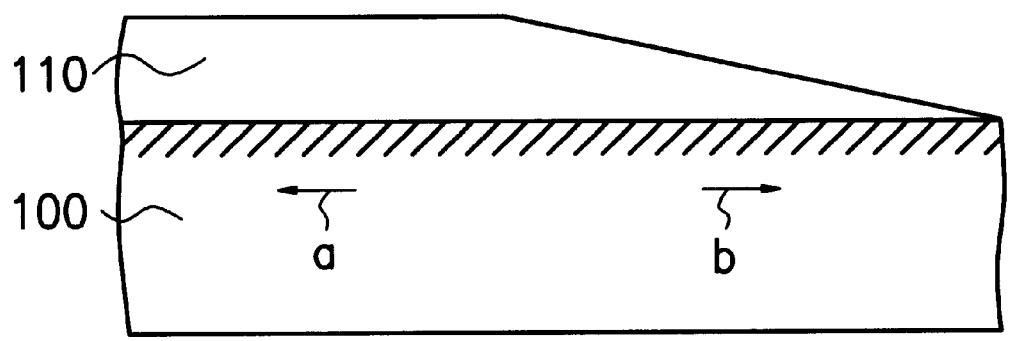
FIG. 3 shows the thickness of photoresist layer on the edge of the wafer by conventional process.

FIGS. 4a through 4d show the manufacturing progression of conducting lines according to one preferred embodiment of this invention. First, referring to FIG. 4a, a substrate 30 is provided. An inter-poly dielectric layer 32 is provided over substrate 30. A polysilicon layer 34 is provided over inter-poly dielectric layer 32. Then, a pattern is defined on polysilicon layer 34 and inter-poly dielectric layer 32 to form a contact window 35 exposing substrate 30. Then, a thin polysilicon layer 36 is formed over polysilicon layer 34 and contact window 35.

Figure 4A:
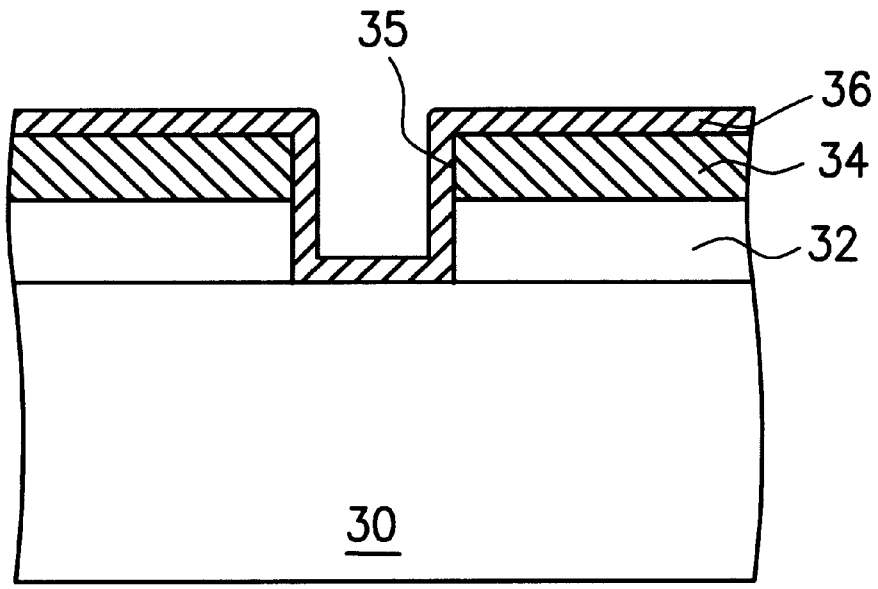
FIGS. 4a to 4d are cross-sectional views showing the progression of manufacturing steps for conducting lines in DRAM devices according to one preferred embodiment of this invention.
Figure 4B:
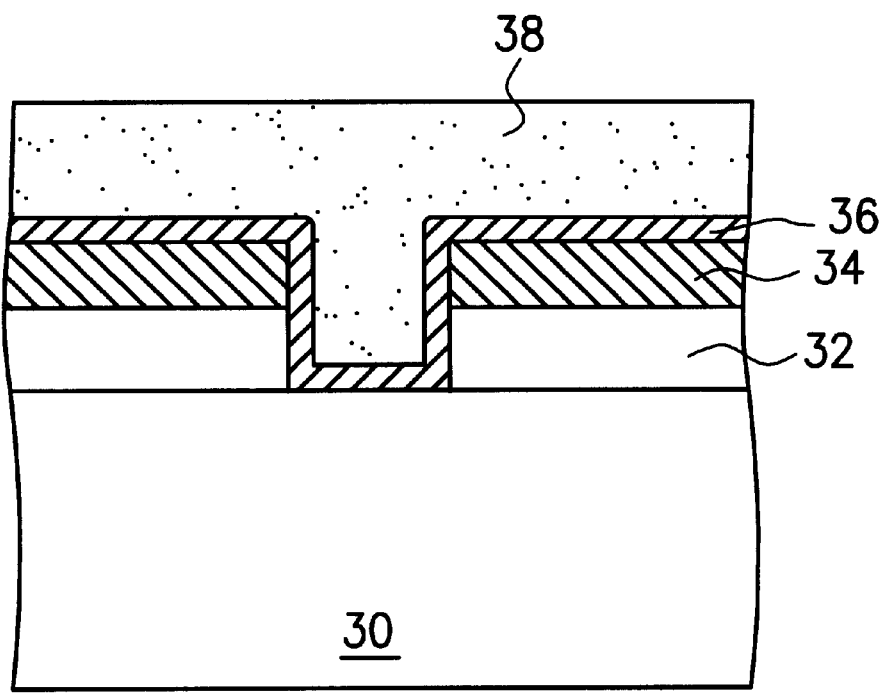
Figure 4C:
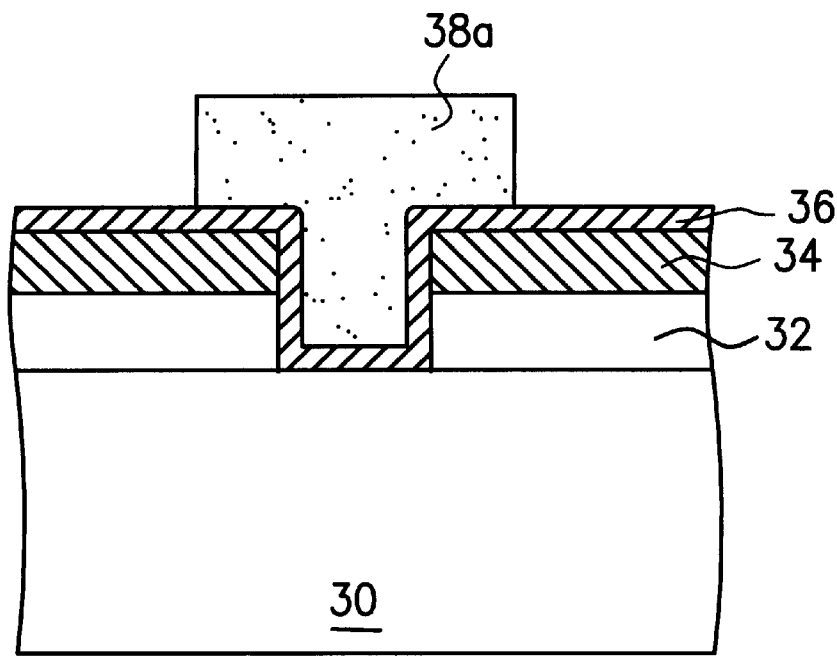

Referring to FIG. 4b, a photoresist layer 38, for example, photosensitive material (Tokyo Ohka-ip3100), is coated over the thin polysilicon layer 36. A pattern is defined on photoresist layer 38 by light, for example, of an ultraviolet ray. Then, photoresist layer 38 at the edge of wafers is defined by edge bead removal. The edge bead removal uses appropriate the chemical reagent on the edge of the wafer. Then, the chemical reagenet, for example, photoresist removing solvent (Tokyo Ohka-NHD-W), can be averaged on the edge of the wafer, for example, about 2.5 mm by centrifugal effect. After exposing and developing the photoresist layer 38, a photoresist layer 38a is remained at the edge of a wafer as shown in FIG. 4c.

Figure 4D:
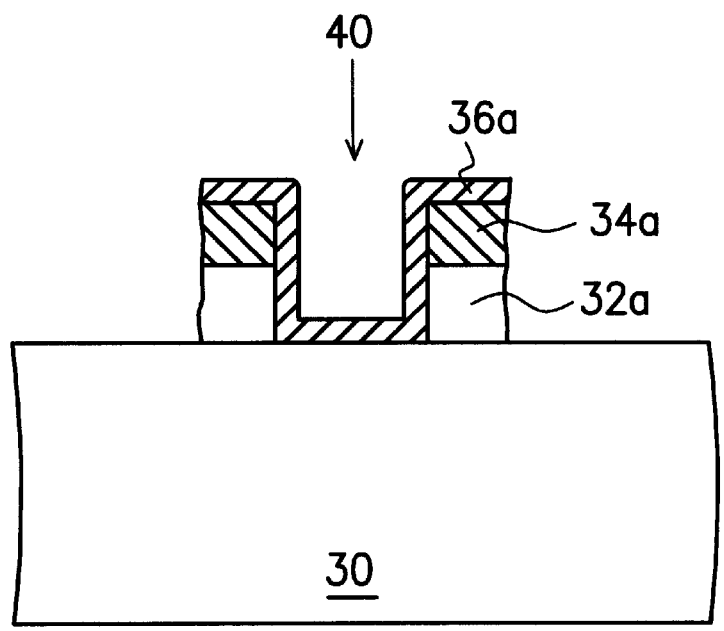

Referring next to FIG. 4d, using photoresist layer, 38a as a mask, thin polysilicon layer 36, polysilicon layer 34 and inter-poly dielectric layer 32 are etched to form a dielectric layer 32a, polysilicon layer 34a and thin polysilicon layer 36a. Therefore, a via 40 is formed by removing photoresist layer 38a.

Figure 5:
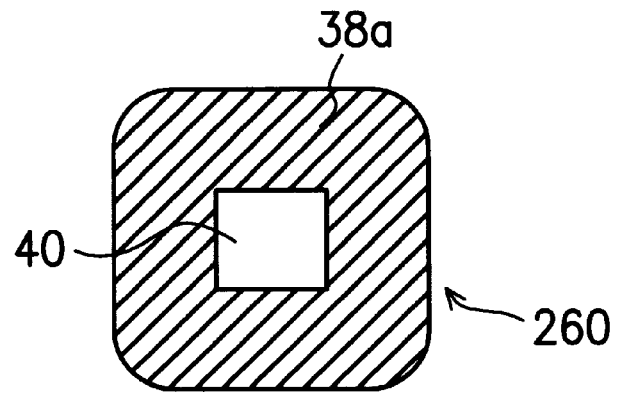
FIG. 5 shows the top view of the via in FIG. 4d.

FIG. 5 shows the top view of via 40 in the FIG. 4d. A conductive line 260 is formed at the edge of the wafer according to this preferred embodiment. The pattern of conductive line 260 is the same with the desired pattern.

Figure 6:
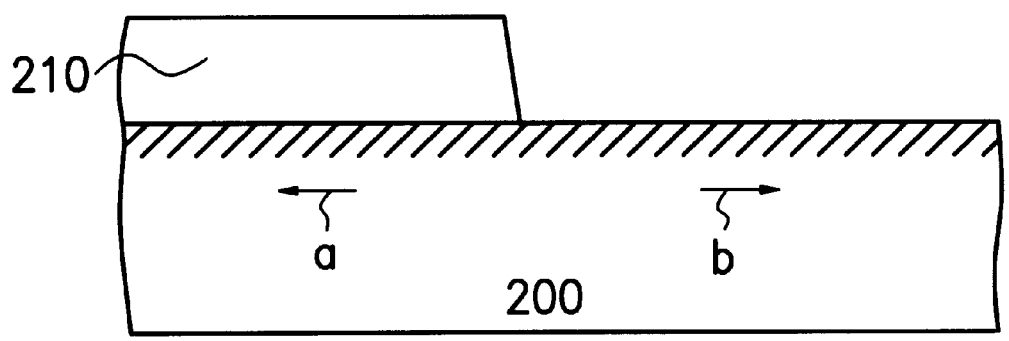
FIG. 6 shows the thickness of the photoresist layer on the edge of the wafer according to this invention.

FIG. 6 shows the thickness of the photoresist layer on the edge of the wafer according to this invention. A photoresist layer 210 is formed over substrate 200. The direction of arrow "a" represents the center of the wafer. The direction of arrow "b" represents the edge of the wafer. According to FIG. 6, the loss of the photoresist layer 210 on the edge of the wafer can be avoided.

Figure 7:
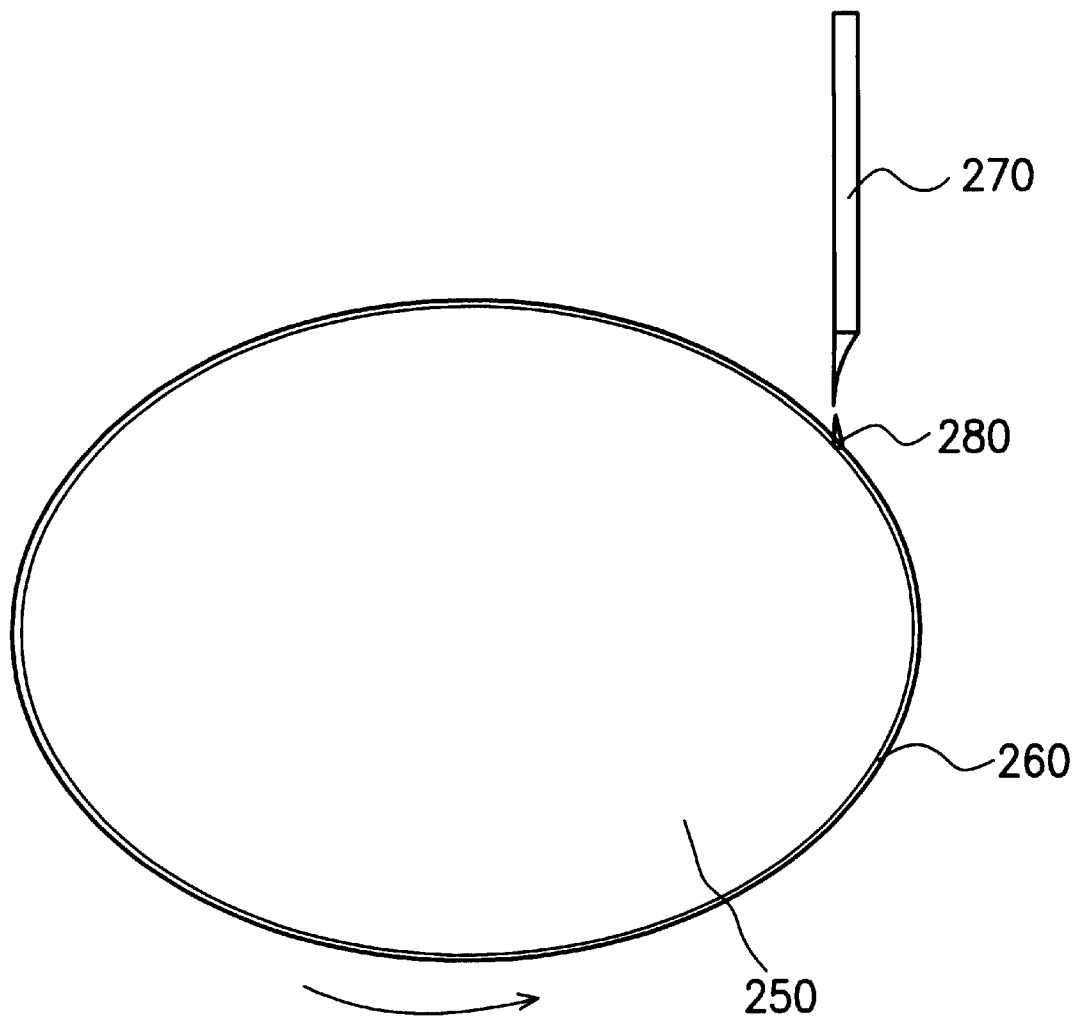
FIG. 7 shows the process of removing the photoresist layer at the edge of wafers by a chemical solvent according to this invention.

Finally. FIG. 7 shows the process of removing the photoresist layer at the edge of wafers by a chemical solvent according to this invention. A chemical reagent 280 is supplied on the edge 260 of the wafer 250 by supplying tube 270. The chemical reagent 280 is averaged on the edge of the wafer by centrifugal effect. The machine used in supplying chemical reagent is the same with the machine used in coating photoresist (not Shown).

Therefore, the character of this invention is to use a chemical reagent and centrifugal effect for defining the photoresist at the edge of wafers instead of conventional exposure method. The edge bead removal method of this invention is accomplished after developing. The photoresist film loss will be avoided by using the edge bead removal method of this invention in DRAM photolithography processes. Additionally, it will keep the photoresist pattern normally and avoid particle problems generated in the following processes. The method of this invention can apply to form pattern of each layer of DRAM fabrication, for example, via, second polysilicon layer and third polysilicon layer. It can increase the yield and throughput.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims the scope of which should be accorded the broadest interpretation so as to encompass all such modifications and similar structures.

What is claimed is:

1. A method of removing photoresist at the edge of wafers in an integrated circuit comprising the steps of:

providing a substrate having at least a MOS component region thereabove;

forming a photoresist layer over said substrate;

defining a pattern on said photoresist layer by exposure and development; and removing said photoresist layer at the edge of said substrate by a chemical reagent and centrifugal effect.

2. A method according to claim 1, wherein the integrated circuit is DRAM.

3. A method according to claim 1, wherein the photoresist layer comprises photosensitive material.

4. A method according to claim 3, wherein the chemical reagent is photoresist removing solvent.

5. A method according to claim 1, the machine for supplying the chemical reagent is the same with the machine for coating the photoresist.

6. A method according to claim 1, the edge of the substrate is about 2.5 mm.

* * * * *